United States Patent [19]

Frangos

[11] 4,219,789

[45] Aug. 26, 1980

[54] STEREO HEADPHONE ADAPTER

[76] Inventor: Thomas A. Frangos, 41 Brooklawn Ter., Lynn, Mass. 01904

[21] Appl. No.: 947,855

[22] Filed: Oct. 2, 1978

[51] Int. Cl.[2] .......... H03H 7/38

[52] U.S. Cl. .......... 333/32; 179/1 R; 179/1 PC

[58] Field of Search .......... 179/1 R, 1 PC, 156 R, 179/1 GP; 333/32; 325/310, 496

[56] References Cited

U.S. PATENT DOCUMENTS

| | | | |
|---|---|---|---|
| 3,194,887 | 7/1965 | Preston | 179/1 PC |
| 3,327,253 | 6/1967 | Campbell | 333/32 X |
| 3,436,333 | 4/1969 | Beaudry | 333/32 X |
| 4,097,111 | 6/1978 | Martin | 179/1 PC X |

*Primary Examiner*—Paul L. Gensler
*Attorney, Agent, or Firm*—Morse, Altman, Oates & Bello

[57] ABSTRACT

An adapter is provided which permits the use of a stereo headset with a monaural radio receiver. The adapter is in the form in a self-contained unit having a plug and a jack, the plug being insertable in the jack of the radio receiver while the jack accommodates the plug of a stereo headset. A transformer is connected between the plug and the jack of the adapter and the jack includes interconnected spaced contacts to provide a monaural signal to both channels of the stereo headset.

5 Claims, 4 Drawing Figures

STEREO HEADPHONE ADAPTER

Background of the Invention

1. Field of the Invention

This invention relates generally to radio accessories and more particularly is directed towards an adapter for use between a monaural radio receiver or the like and a stereo headset to allow one to be used with the other.

2. Description of the Prior Art

Many radio receivers, particularly those of a utilitarian class such as aircraft radio receivers are monaural and any headset used with such a monaural receiver heretofore has been of a monaural type having an impedance matched to that of the receiver. Typically, a person owning or using such a radio will have a separate monaural headset for use with the monaural receiver. Pilots for example, normally will have a personal monaural headset for use when flying. Many such individuals who frequently operate monaural receivers will have personal home stereo systems which includes stereo headsets. Such headsets heretofore could not be used with a monaural receiver for various reasons, one of which includes the characteristic low input impedance of the stereo headset which does not match with the characteristically high output impedance of the monaural receiver.

Accordingly, it is an object of the present invention to provide an adapter which allows a stereo headset to be used with a monaural receiver. Another object of this invention is to provide a small, inexpensive adapter which may be readily connected to and disconnected from a monaural receiver to allow either a stereo headset to be used with the adapter in place or a monaural headset to be used by simply removing the adapter.

SUMMARY OF THE INVENTION

This invention features an adapter for allowing a stereo headset to be connected to a monaural receiver, comprising a housing, a monaural plug extending from the housing for insertion in the jack of a monaural receiver, a three conductor jack in said housing to receive the plug of a stereo headset and a transformer connected between the plug and the jack of the adapter for effectively raising the impedance of the stereo headset connected thereto. Contacts are provided on the adapter jack for connecting the single channel from the receiver to both channels of the headset.

DETAILED DESCRIPTION OF THE PREFERRED EMBODIMENT

Figure 1:
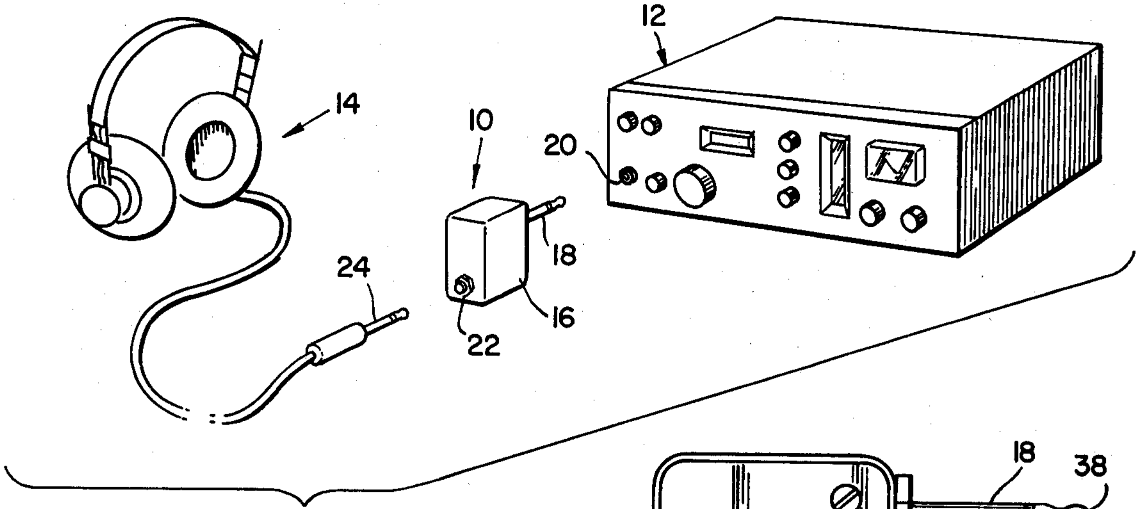
FIG. 1 is an exploded view in perspective showing an adapter made according to the invention in operative relation with a receiver and headset.

Referring now to the drawings, the reference character 10 generally indicates an adapter for use with a monaural radio receiver 12 and a stereo headset 14. While a monaural radio set is illustrated, the adapter may be used with other monaural audio equipment. Typically, a monaural headset used with a monaural radio receiver will have an impedance of 600 ohms to match the 600 ohms output impedance of the receiver. A standard stereo headset on the other hand typically has an impedance on the order of 8 ohms and thus would not function properly with a 600 ohm receiver. In addition a standard stereo headset is designed to function on two channels rather than a single channel output characteristic of the monaural receiver.

The adapter 10 when connected to the receiver 12 would allow the use of an 8 ohm stereo headset with a 600 ohm or other high impedance monaural receiver.

Figure 4:
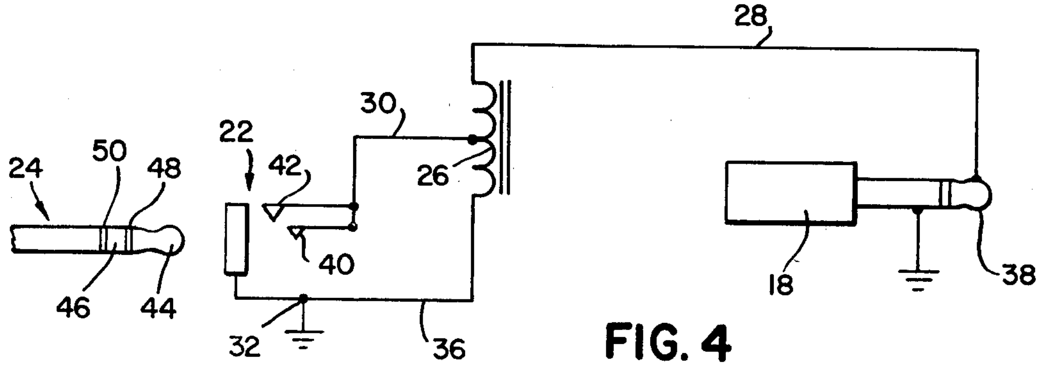

The adapter 10 is generally organized about a housing 16 which can be relatively small, on the order of perhaps $1\frac{1}{2}\times2''$ by $1''$, to allow it to be carried about easily in the pocket. While the configuration is shown in a general box shape, obviously other configurations may be conveniently employed. In any event the housing 16 includes a plug 18, adapted to be inserted in a jack 20 on the radio 12, and a jack 22, adapted to receive a plug 24 connected to the stereo headset 14. Mounted within the housing 16 and connected to both the plug 18 and the jack 22 is a transformer 26. In the preferred embodiment of this invention the transformer 26 is a miniature iron-core, step down autotransformer with a primary impedance of approximately 500 to 600 ohms and a secondary impedance of 4 to 16 ohms. The primary to secondary turns ratio can be anywhere from approximately 5.6:1 to 11.2:1, depending upon the impedances under consideration. The transformer is connected to the plug 18 by means of a lead 28 and to both nongrounded contacts 40 and 42 of the jack 22 by means of a lead 30, as best shown in the circuit diagram of FIG. 4. The transformer ground is connected to a ground lug 32 on the jack by lead 36. The jack body with its grounding lug and the plug ground are grounded by direct contact with the metal housing 16 which also serves as a common ground. If a metallic housing is not used, the plug, jack and transformer grounds are wired together.

The primary or input impedance of a transformer depends on the impedance connected at the secondary windings which in this instance is the headset. The impedance looking into the primary is much higher if there is no load on the secondary windings and is almost like an open circuit. The advantage of using a transformer in this manner is not so much the transformer impedance itself but rather the multiplying of impedance seen looking into the primary when a load is connected to the secondary. In effect, the receiver looks into the primary but will not see the proper impedance unless the headphones are plugged into the adapter.

Figure 2:
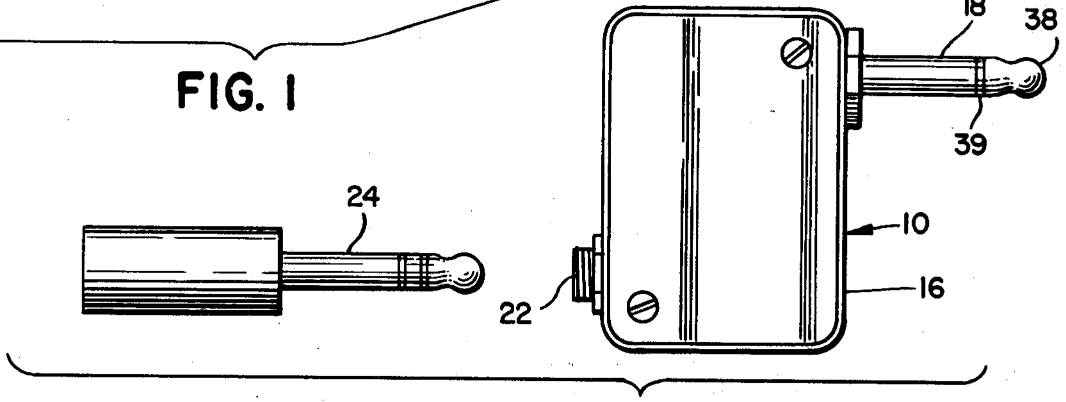
FIG. 2 is an exploded view in side elevation of the adapter and the headset plug.
Figure 3:
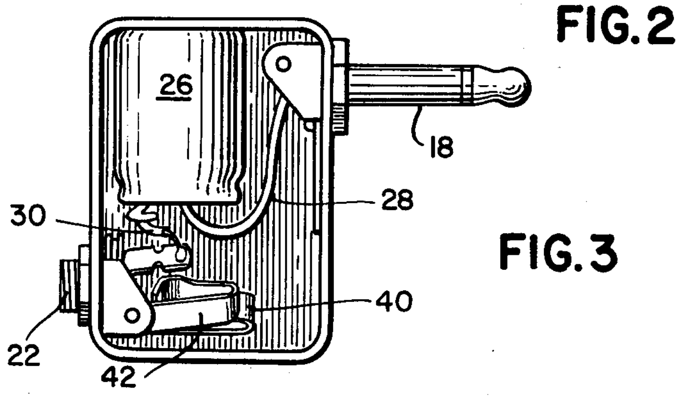
FIG. 3 is a view in side elevation of the adapter with the cover plate removed, and, FIG. 4 is a schematic diagram of the adapter circuit.

The plug 18 as best shown in FIGS. 2 and 3 is configured for single channel operation having but a single conductive head 38 which is connected by the lead 28 to the transformer 26. The plug ground is insulated from the head 38 by a dielectric spacer 39. Thus, when the plug 18 is inserted in the radio jack 20 the monaural output will pass through the lead 28 to the transformer 26 and eventually be coupled to the headset 14 which will appear as a high impedance substantially matching that of a receiver. From the transformer 26 the signal is fed to a pair of jack contacts 40 and 42 spaced apart in order to electrically contact conductive sections 44 and 46 of the stereo plug 24 which sections are axially separated from one another by dielectric spacers 48 and 50. With the plug 24 inserted in the jack 22, contact 40 will engage the plug tip 44 while the contact 42 will engage the conductive segment 46 and the third and largest plug segment will contact the grounded section of the jack, providing a monaural signal to both earphones of the headset 14.

The circuit is such that the transformer 26 changes the impedance of the load so that the receiver 12 sees approximately 600 ohms impedance at the plug 18 with the headset plugged into the adapter. Thus, the impedance of the headset is matched to the impedance of the receiver, allowing the stereo headset to operate as a monaural headset. Since the adapter may be readily connected and disconnected to the radio, no permanent alteration is made and a standard headset may be used with the radio by merely unplugging the adapter. Similarly, the stereo headset may be used with standard stereo equipment or by simply inserting the stereo plug in the adapter and then plugging the adapter into the receiver 12 the utility of the stereo headset is increased. A single stereo headset thus may be employed with either stereo or monaural equipment by means of a simple adapter that is quickly and easily installed and removed, as desired.

Having thus described the invention, what I claim and desire to obtain by Letters Patent of the United States is:

1. An adapter for converting a low impedance stereo headset for use with a high output impedance monaural radio receiver or the like, comprising (a) a housing, (b) a monaural adapter plug mounted to and extending from said housing for insertion in a cooperating monaural receiver jack, (c) a stereo adapter jack mounted to said housing for receiving a stereo headset plug insertable therein, (d) a transformer connected to said monaural adapter plug and stereo adapter jack, said transformer having an impedance matching capability sufficient to substantially match the impedance of the monaural receiver to the impedance of the stereo headset, (e) said adapter jack including a pair of electrically connected axially spaced contacts connected to said transformer and adapted to contact the stereo headset plug at different axially spaced points.

2. An adapter according to claim 1 wherein said adapter plug and adapter jack are mounted to opposite sides of said housing and in parallel relation.

3. An adapter according to claim 1 wherein said transformer is an iron-core, step down autotransformer.

4. An adapter according to claim 3 wherein the primary to secondary turns ratio of said transformer is in the range of approximately 5.6:1 to 11.2:1.

5. An adapter according to claim 1 wherein the input impedance of said transformer with approximately an 8 ohm secondary load is in the range of 500 to 600 ohms.

* * * * *